US010861710B2

(12) United States Patent
Kuo et al.

(10) Patent No.: US 10,861,710 B2
(45) Date of Patent: Dec. 8, 2020

(54) METHODS OF MANUFACTURING SEMICONDUCTOR DEVICES

(71) Applicant: Taiwan Semiconductor Manufacturing Company, Ltd., Hsinchu (TW)

(72) Inventors: Hung-Jui Kuo, Hsinchu (TW); Ming-Tan Lee, Kaohsiung (TW); Chen-Cheng Kuo, Chu-Pei (TW); De-Yuan Lu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/148,649

(22) Filed: Oct. 1, 2018

(65) Prior Publication Data

US 2020/0006086 A1 Jan. 2, 2020

Related U.S. Application Data

(60) Provisional application No. 62/691,878, filed on Jun. 29, 2018.

(51) Int. Cl.

| | |
|---|---|
| ***H01L 21/027*** | (2006.01) |
| ***H01L 21/48*** | (2006.01) |
| ***H01L 21/56*** | (2006.01) |
| ***H01L 21/683*** | (2006.01) |
| ***H01L 23/31*** | (2006.01) |
| ***H01L 23/538*** | (2006.01) |
| ***H01L 23/00*** | (2006.01) |
| ***H01L 25/10*** | (2006.01) |
| ***H01L 25/00*** | (2006.01) |

(52) U.S. Cl.

CPC ...... *H01L 21/4853* (2013.01); *H01L 21/4857* (2013.01); *H01L 21/565* (2013.01); *H01L 21/6835* (2013.01); *H01L 23/3107* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/105* (2013.01); *H01L 25/50* (2013.01); *H01L 2221/68372* (2013.01); *H01L 2224/214* (2013.01); *H01L 2225/1035* (2013.01); *H01L 2225/1058* (2013.01)

(58) Field of Classification Search

CPC .................................................. H01L 21/0274
USPC ......................................................... 438/126
See application file for complete search history.

(56) References Cited

U.S. PATENT DOCUMENTS

| | | | |
|---|---|---|---|
| 9,842,826 | B2 | 12/2017 | Lin et al. |
| 10,090,194 | B2 | 10/2018 | Liu et al. |

(Continued)

FOREIGN PATENT DOCUMENTS

| | | |
|---|---|---|
| TW | 201703219 A | 1/2017 |
| TW | 201735106 A | 10/2017 |
| TW | 201821539 A | 6/2018 |

*Primary Examiner* — Hsin Yi Hsieh
(74) *Attorney, Agent, or Firm* — Slater Matsil, LLP

(57) ABSTRACT

A semiconductor device and method of making a conductive connector is provided. In an embodiment an opening is formed within a photoresist by adjusting the center point of an in-focus area during the exposure process. Once the photoresist has been developed to form an opening, an after development baking process is utilized to reshape the opening. Once reshaped, a conductive material is formed into the opening to take on the shape of the opening.

20 Claims, 10 Drawing Sheets

621
603
517
601
515
513
$D_1$
$H_1$
Cp
613
$W_1$

(56) References Cited

U.S. PATENT DOCUMENTS

| | | | | |
|---|---|---|---|---|
| 2012/0091574 | A1 | 4/2012 | Lin et al. | |
| 2017/0271203 | A1* | 9/2017 | Liu | H01L 23/49827 |
| 2018/0061669 | A1 | 3/2018 | Liao et al. | |
| 2019/0237391 | A1* | 8/2019 | Sattiraju | H01L 21/48 |

* cited by examiner

METHODS OF MANUFACTURING SEMICONDUCTOR DEVICES

PRIORITY CLAIM AND CROSS-REFERENCE

This application claims priority to and the benefit of U.S. Provisional Application No. 62/691,878, filed on Jun. 29, 2018, and entitled "Semiconductor Device and Method of Manufacture," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
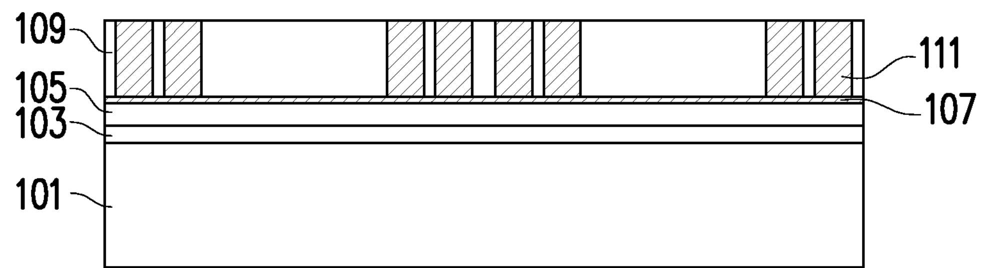
FIG. 1 illustrates a formation of through interposer vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a carrier substrate 101 with an adhesive layer 103, a polymer layer 105, and a first seed layer 107 over the carrier substrate 101. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be polybenzoxazole (PBO), although any suitable material, such as polyimide or a polyimide derivative, Solder Resistance (SR), or Ajinomoto build-up film (ABF) may be utilized. The polymer layer 105 may be placed using, e.g., a spin-coating process to a thickness of between about 2 μm and about 15 μm, such as about 5 μm, although any suitable method and thickness may be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 μm and about 1 μm, such as about 0.5 μm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 μm and about 250 μm, such as about 120 μm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device 301 are placed on opposing sides of the vias 111, may be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2:
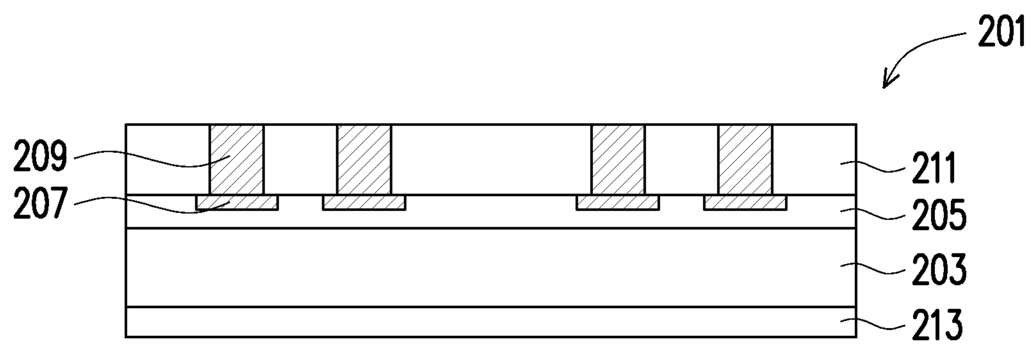
FIG. 2 illustrates a semiconductor device in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional desires of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads 207 may be formed to have a thickness of between about 0.5 μm and about 4 μm, such as about 1.45 μm.

The first passivation layer 211 may be formed on the first substrate 203 over the first metallization layers 205 and the first contact pads 207. The first passivation layer 211 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 211 may be formed through a process such as chemical vapor deposition (CVD), although any suitable process may be utilized, and may have a thickness between about 0.5 μm and about 5 μm, such as about 9.25 KÅ.

The first external connectors 209 may be formed to provide conductive regions for contact between the first contact pads 207 and, e.g., a first redistribution layer 501 (not illustrated in FIG. 2 but illustrated and described below with respect to FIG. 5). In an embodiment the first external connectors 209 may be conductive pillars and may be formed by initially forming a photoresist (not shown) over the first passivation layer 211 to a thickness between about 5 μm to about 20 μm, such as about 10 μm. The photoresist may be patterned to expose portions of the first passivation layers through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may be utilized. All suitable processes are fully intended to be included within the scope of the present embodiments.

On an opposite side of the first substrate 203 than the first metallization layers 205, a die attach film (DAF) 213 may be formed in order to assist in the attachment of the first semiconductor device 201 to the polymer layer 105. In an embodiment the die attach film 213 is an epoxy resin, a phenol resin, acrylic rubber, silica filler, or a combination thereof, and is applied using a lamination technique. However, any other suitable material and method of formation may be utilized.

Figure 3:
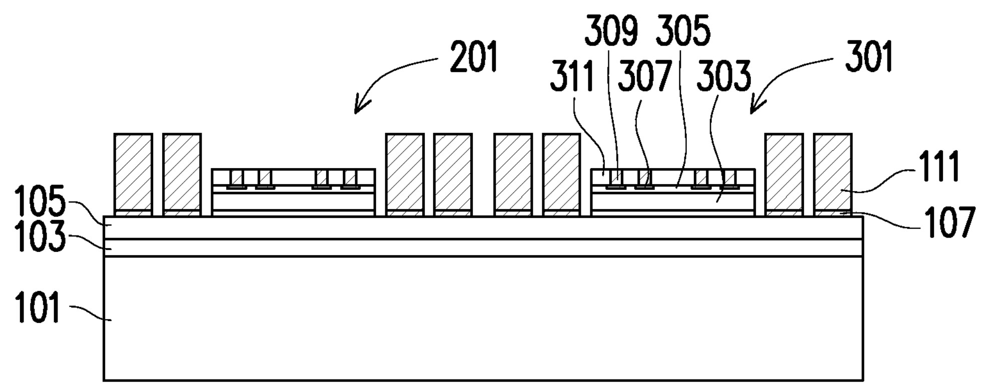
FIG. 3 illustrates a placement of the semiconductor device in accordance with some embodiments.

FIG. 3 illustrates a placement of the first semiconductor device 201 onto the polymer layer 105 along with a placement of a second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other method of placing the first semiconductor device 201 and the second semiconductor device 301 may be used.

Figure 4:
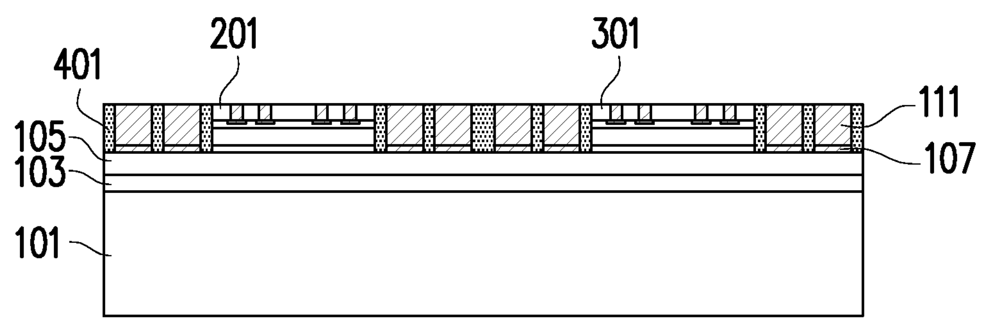
FIG. 4 illustrates an encapsulant of the through interposer vias and the semiconductor device in accordance with some embodiments.

FIG. 4 illustrates an encapsulation of the vias 111, the first semiconductor device 201 and the second semiconductor device 301. The encapsulation may be performed in a molding device (not individually illustrated in FIG. 4), which may comprise a top molding portion and a bottom molding portion separable from the top molding portion. When the top molding portion is lowered to be adjacent to the bottom molding portion, a molding cavity may be formed for the carrier substrate 101, the vias 111, the first semiconductor device 201, and the second semiconductor device 301.

During the encapsulation process the top molding portion may be placed adjacent to the bottom molding portion, thereby enclosing the carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (on the first semiconductor device 201), and the second external connectors 309 (on the second semiconductor device 301) have been exposed. As such, the first semiconductor device 201, the second semiconductor device 301, and the vias 111 may have a planar surface that is also coplanar with the encapsulant 401.

However, while the CMP process described above is presented as one illustrative embodiment, it is not intended to be limiting to the embodiments. Any other suitable removal process may be used to thin the encapsulant 401, the first semiconductor device 201, and the second semiconductor device 301 and expose the vias 111. For example, a series of chemical etches may be utilized. This process and any other suitable process may be utilized to thin the encapsulant 401, the first semiconductor device 201, and the second semiconductor device 301, and all such processes are fully intended to be included within the scope of the embodiments.

Optionally, after the encapsulant 401 has been thinned, the vias 111, the first external connectors 209, and the second external connectors 309 may be recessed within the encapsulant 401. In an embodiment the vias 111, the first external connectors 209, and the second external connectors 309 may be recessed using, e.g., an etching process that utilizes an etchant that is selective to the material of the vias 111, the first external connectors 209, and the second external connectors 309 (e.g., copper). The vias 111, the first external connectors 209, and the second external connectors 309 may be recessed to a depth of between about 20 μm and about 300 μm, such as about 180 μm.

Figure 5:
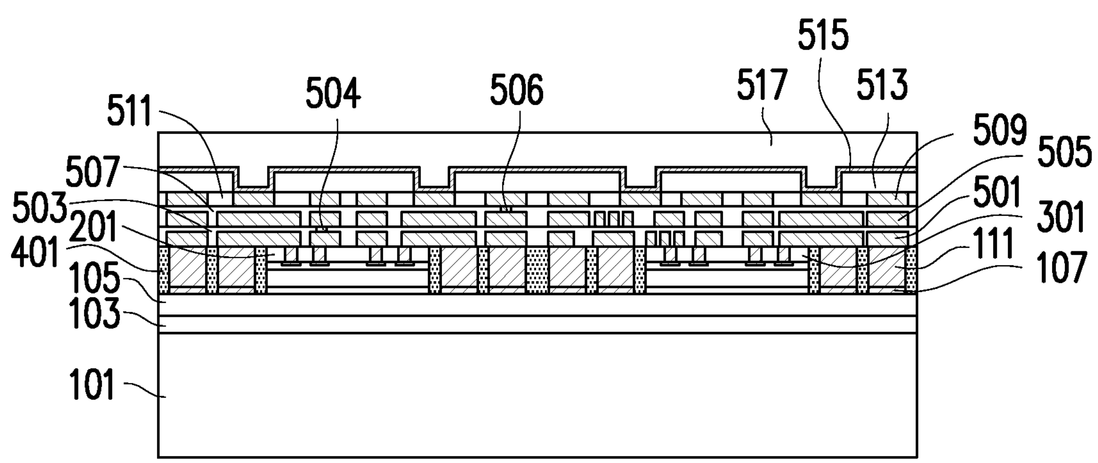
FIG. 5 illustrates a placement of a photoresist in accordance with some embodiments.

FIG. 5 illustrates cross-sectional views of a formation of a first redistribution layer (RDL) 501, a second redistribution layer 505, and a third redistribution layer 509 in order to interconnect the first semiconductor device 201, the second semiconductor device 301, and the vias 111. In an embodiment the first redistribution layer 501 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the first redistribution layer 501 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the first redistribution layer 501.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 5 also illustrates a formation of a third passivation layer 503 over the first redistribution layer 501 in order to provide protection and isolation for the first redistribution layer 501 and the other underlying structures. In an embodiment the third passivation layer 503 may be polybenzoxazole (PBO), although any suitable material, such as polyimide or a polyimide derivative, may be utilized. The third passivation layer 503 may be placed using, e.g., a spin-coating process to a thickness of between about 5 μm and about 25 μm, such as about 7 μm, although any suitable method and thickness may be used.

After the third passivation layer 503 has been formed, first openings 504 (only one of which is illustrated in FIG. 5 for clarity) may be made through the third passivation layer 503 by removing portions of the third passivation layer 503 to expose at least a portion of the underlying first redistribution layer 501. The first openings 504 allows for contact between the first redistribution layer 501 and a second redistribution layer 505 (described further below). The first openings 504 may be formed using a suitable photolithographic mask and etching process, although any suitable process to expose portions of first redistribution layer 501 may be used.

The second redistribution layer 505 may be formed to provide additional routing and connectivity and in electrical connection with the first redistribution layer 501. In an embodiment the second redistribution layer 505 may be formed similar to the first redistribution layer 501. For example, a seed layer may be formed, a photoresist may be placed and patterned on top of the seed layer, and conductive material may be plated into the patterned openings through the photoresist. Once formed, the photoresist may be removed, the underlying seed layer may be etched, the second redistribution layer 505 may be covered by a fourth passivation layer 507 (which may be similar to the third passivation layer 503), and the fourth passivation layer 507 may be patterned to form second openings 506 (only one of which is illustrated in FIG. 5 for clarity) and expose an underlying conductive portion of the second redistribution layer 505.

The third redistribution layer 509 may be formed to provide additional routing along with electrical connection to the second redistribution layer 505. In an embodiment the third redistribution layer 509 may be formed using materials and processes similar to the first redistribution layer 501. For example, a seed layer may be formed, a photoresist may be placed and patterned on top of the seed layer in a desired pattern for the third redistribution layer 509, conductive material is plated into the patterned openings of the photoresist, the photoresist is removed, and the seed layer is etched.

However, in addition to simply rerouting the electrical connections (similar to the second redistribution layer 505), the third redistribution layer 509 may also comprise a landing pad that will be utilized to form an electrical connection to, e.g., an overlying third external connection 901 (described further below). The landing pad may be shaped in order to make suitable physical and electrical connection with the third external connection 901.

Once the third redistribution layer 509 has been formed, the third redistribution layer 509 may be covered by a fifth passivation layer 511. The fifth passivation layer 511, similar to the third passivation layer 503, may be formed from a polymer such as PBO, or may be formed of a similar material as the third passivation layer 503 (e.g., polyimide or a polyimide derivative). The fifth passivation layer 511 may be formed to have a thickness of between about 2 μm and about 15 μm, such as about 5 μm.

Once in place over the third redistribution layer 509, the fifth passivation layer 511 may be planarized with the third redistribution layer 509. In an embodiment the planarization may be performed using, e.g., a chemical mechanical polishing process, whereby etchants and abrasives are utilized along with a rotating platen in order to chemically and mechanically remove portions of the fifth passivation layer 511 until the fifth passivation layer 511 is coplanar with the third redistribution layer 509. However, any suitable planarization process, such as a series of one or more etches or a mechanical grinding process, may be utilized.

After the fifth passivation layer 511 has been formed and planarized, a sixth passivation layer 513 may be placed and patterned over the fifth passivation layer 511 and the third redistribution layer 509. In an embodiment the sixth passivation layer 513 may be a similar material as the fifth passivation layer 511 (e.g., PBO) and the sixth passivation layer 513 may be patterned in order to expose an underlying portion of the third redistribution layer 509. In an embodiment the sixth passivation layer 513 may be patterned using a photolithographic masking and etching process, whereby a photoresist is deposited and patterned and then used as a mask during an etching process in order to remove portions of the sixth passivation layer 513 and expose portions of the third redistribution layer 509. However, any suitable method of patterning the sixth passivation layer 513 may be utilized.

After the sixth passivation layer 513 has been formed and patterned, a second seed layer 515 is deposited over the sixth passivation layer 513. In an embodiment the second seed layer 515 is a thin layer of a conductive material that aids in the formation of a thicker layer during subsequent processing steps. The second seed layer 515 may comprise a layer of titanium about 1,000 Å thick followed by a layer of copper about 5,000 Å thick. The second seed layer 515 may be created using processes such as sputtering, evaporation, or PECVD processes, depending upon the desired materials. The second seed layer 515 may be formed to have a thickness of between about 0.3 μm and about 1 μm, such as about 0.5 μm.

Once the second seed layer 515 has been deposited, a photoresist 517 may be placed onto the second seed layer 515 to prepare for a formation of the third external connection 901. In an embodiment the photoresist 517 includes a photoresist polymer resin along with one or more photoactive compounds (PACs) in a photoresist solvent. In an embodiment the photoresist polymer resin may comprise a hydrocarbon structure (such as an alicyclic hydrocarbon structure) that contains one or more groups that will decompose (e.g., an acid labile group) or otherwise react when mixed with acids, bases, or free radicals generated by the PACs (as further described below with respect to FIG. 6A). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is a photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl) imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the photoresist polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 517 has been developed, thereby helping to reduce the number of defects that occur during development. In an embodiment the lactone groups may include rings having five to seven members, although any suitable lactone structure may be used for the lactone group.

The photoresist polymer resin may also comprise groups that can assist in increasing the adhesiveness of the photoresist 517 to underlying structures. In an embodiment polar groups may be used to help increase the adhesiveness, and polar groups that may be used in this embodiment include hydroxyl groups, cyano groups, or the like, although any suitable polar group may be utilized.

Optionally, the photoresist polymer resin may further comprise one or more alicyclic hydrocarbon structures that do not also contain a group which will decompose. In an embodiment the hydrocarbon structure that does not contain a group which will decompose may include structures such as 1-adamantyl(meth)acrylate, tricyclodecanyl (meth)acrylate, cyclohexayl (methacrylate), combinations of these, or the like.

Additionally, the photoresist 517 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthoquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may be utilized, and all such PACs are fully intended to be included within the scope of the present embodiments.

The individual components of the photoresist 517 may be placed into the photoresist solvent in order to aid in the mixing and placement of the photoresist 517. To aid in the mixing and placement of the photoresist 517, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the photoresist solvent for the photoresist 517 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monopheylether, dipropylene glycol monoacetate, dioxane, methyl lactate, ethyl lactate, methyl acetate, ethyl acetate, butyl acetate, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl propionate, ethyl propionate and ethyl ethoxy propionate, methylethyl ketone, cyclohexanone, 2-heptanone, carbon dioxide, cyclopentatone, cyclohexanone, ethyl 3-ethoxypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the photoresist solvent component of the photoresist 517 are merely illustrative and are not intended to limit the embodiments. Rather, any suitable material that may dissolve the photoresist polymer resin and the PACs may be utilized to help mix and apply the photoresist 517. All such materials are fully intended to be included within the scope of the embodiments.

Additionally, while individual ones of the above described materials may be used as the photoresist solvent for the photoresist 517, in embodiments more than one of the above described materials may be utilized. For example, the photoresist solvent may comprise a combination mixture of two or more of the materials described. All such combinations are fully intended to be included within the scope of the embodiments.

Optionally, a photoresist cross-linking agent may also be added to the photoresist 517. The photoresist cross-linking agent reacts with the photoresist polymer resin within the photoresist 517 after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a photoresist cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetramethoxymethylated glycoluril, mono-, di-, tri-, and/or tetraethoxymethylated glycoluril, mono-, di-, tri-, and/or tetrapropoxymethylated glycoluril, and mono-, di-, tri-, and/or tetra-butoxymethylated glycoluril, 2,3-dihydroxy-5-hydroxymethylnorbornane, 2-hydroxy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl) ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ethe-r of a phenol novolak resin, pentaerythritol tetra(3-acetoxy-2-hydroxyprop-yl)ether, pentaerythritol poly(3-chloroacetoxy-2-hydroxypropyl)ether, trimethylolmethane tri(3-acetoxy-2-hydroxypropyl)ether, combinations of these, or the like.

In addition to the photoresist polymer resins, the PACs, the radical inhibitors, the photoresist solvents, and the photoresist cross-linking agents, the photoresist 517 may also include a number of other additives that will assist the photoresist 517 obtain the highest resolution. For example, the photoresist 517 may also include surfactants, quenchers, stabilizers, plasticizers, coloring agents, adhesion additives, surface leveling agents, combinations of these, or the like. Any suitable additives may be utilized.

In an embodiment the photoresist polymer resin, the PACs, the radical inhibitors, along with any desired additives or other agents, are added to the photoresist solvent for application. Once added, the mixture is then mixed in order to achieve an even composition throughout the photoresist 517 in order to ensure that there are no defects caused by an uneven mixing or non-constant composition of the photoresist 517. Once mixed together, the photoresist 517 may either be stored prior to its usage or else used immediately.

Once ready, the photoresist 517 may be utilized by initially applying the photoresist 517 onto the second seed layer 515. The photoresist 517 may be applied to the second seed layer 515 so that the photoresist 517 coats an upper exposed surface of the second seed layer 515, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 517 may be applied such that it has a thickness over the surface of the second seed layer 515 of between about 10 nm and about 300 nm, such as about 150 nm.

Once the photoresist 517 has been applied to the semiconductor substrate, a pre-bake of the photoresist 517 is performed in order to cure and dry the photoresist 517 prior to exposure to finish the application of the photoresist 517. The curing and drying of the photoresist 517 removes the photoresist solvent component while leaving behind the photoresist polymer resin, the PACs, the radical inhibitors, the photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist 517. The pre-bake is performed for a time sufficient to cure and dry the photoresist 517, such as between about 10 seconds to about 5 minutes, such as about 90 seconds.

Figure 6A:
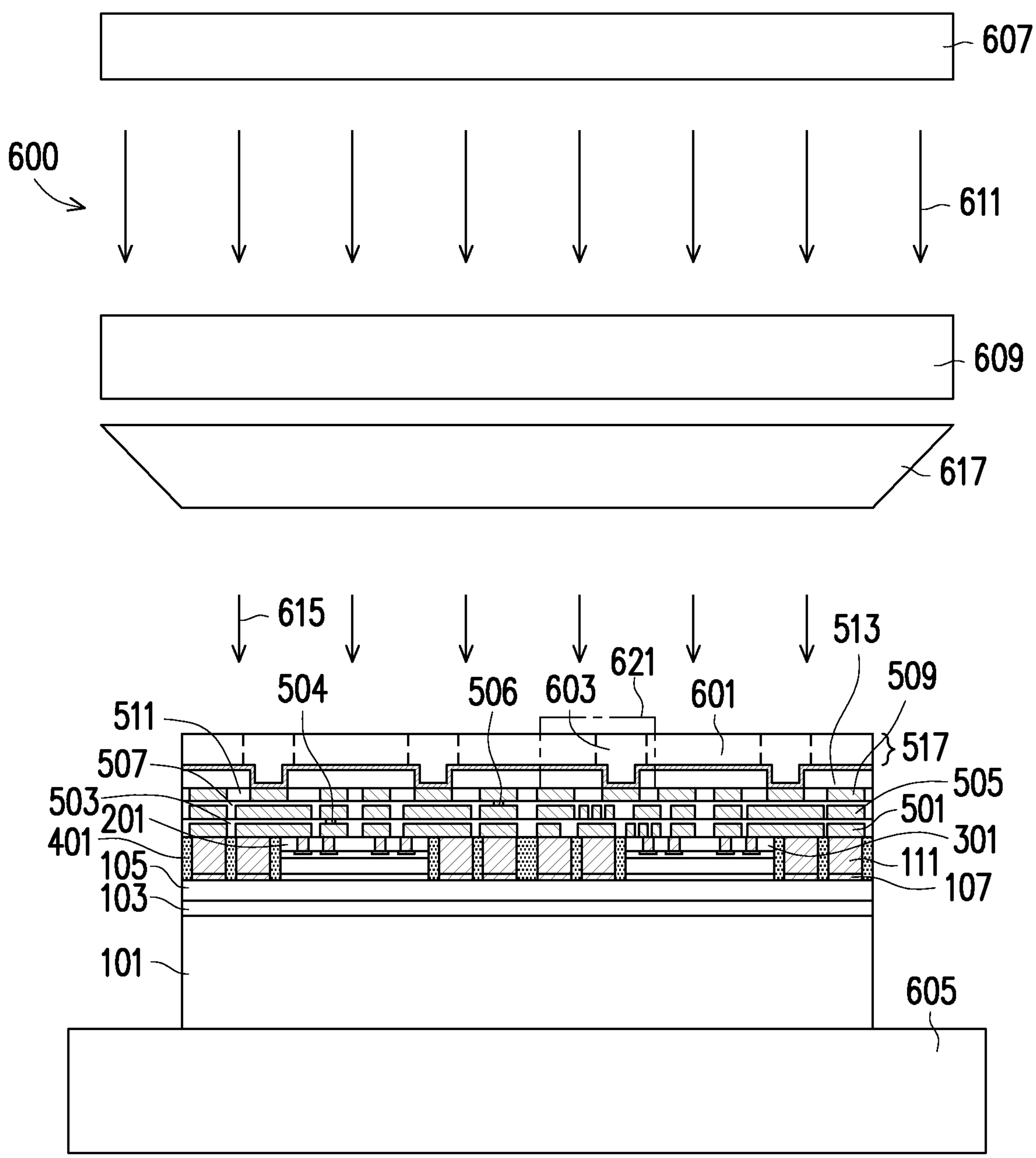
FIGS. 6A-6D illustrate an exposure of the photoresist in accordance with some embodiments.

FIG. 6A illustrates an exposure of the photoresist 517 to form an exposed region 601 and an unexposed region 603 within the photoresist 517. In an embodiment the exposure may be initiated by placing the semiconductor device 100 and the photoresist 517, once cured and dried, into an imaging device 600 for exposure. The imaging device 600 may comprise a support plate 605, an energy source 607, a patterned mask 609 between the support plate 605 and the energy source 607, and optics 617. In an embodiment the support plate 605 is a surface to which the semiconductor device 100 and the photoresist 517 may be placed or attached to and which provides support and control to the carrier substrate 101 during exposure of the photoresist 517. Additionally, the support plate 605 may be movable along one or more axes, as well as providing any desired heating or cooling to the carrier substrate 101 and photoresist 517 in order to prevent temperature gradients from affecting the exposure process.

In an embodiment the energy source 607 supplies energy 611 such as light to the photoresist 517 in order to induce a reaction of the PACs, which in turn reacts with the polymer resin to chemically alter those portions of the photoresist 517 to which the energy 611 impinges. In an embodiment the energy 611 may be electromagnetic radiation, such as g-rays (with a wavelength of about 436 nm), i-rays (with a wavelength of about 365 nm), ultraviolet radiation, far ultraviolet radiation, extreme ultraviolet radiation, x-rays, electron beams, or the like. The energy source 607 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of energy 611, such as mercury vapor lamps, xenon lamps, carbon arc lamps or the like, may also be utilized.

The patterned mask 609 is located between the energy source 607 and the photoresist 517 in order to block portions of the energy 611 to form a patterned energy 615 prior to the energy 611 actually impinging upon the photoresist 517. In an embodiment the patterned mask 609 may comprise a series of layers (e.g., substrate, absorbance layers, anti-reflective coating layers, shielding layers, etc.) to reflect, absorb, or otherwise block portions of the energy 611 from reaching those portions of the photoresist 517 which are not desired to be illuminated. The desired pattern may be formed in the patterned mask 609 by forming openings through the patterned mask 609 in the desired shape of illumination.

Optics (represented in FIG. 6A by the trapezoid labeled 617) may be used to concentrate, expand, reflect, or otherwise control the energy 611 as it leaves the energy source 607, is patterned by the patterned mask 609, and is directed towards the photoresist 517. In an embodiment the optics 617 comprise one or more lenses, mirrors, filters, combinations of these, or the like to control the energy 611 along its path. Additionally, while the optics 617 are illustrated in FIG. 6A as being between the patterned mask 609 and the photoresist 517, elements of the optics 617 (e.g., individual lenses, mirrors, etc.) may also be located at any location between the energy source 607 (where the energy 611 is generated) and the photoresist 517.

In an embodiment the semiconductor device 100 with the photoresist 517 is placed on the support plate 605. Once the pattern has been aligned to the semiconductor device 100, the energy source 607 generates the desired energy 611 (e.g., light) which passes through the patterned mask 609 and the optics 617 on its way to the photoresist 517. The patterned energy 615 impinging upon portions of the photoresist 517 induces a reaction of the PACs within the photoresist 517. The chemical reaction products of the PACs' absorption of the patterned energy 615 (e.g., acids/bases/free radicals) then reacts with the polymer resin, chemically altering the photoresist 517 in those portions that were illuminated through the patterned mask 609.

Figure 6B:
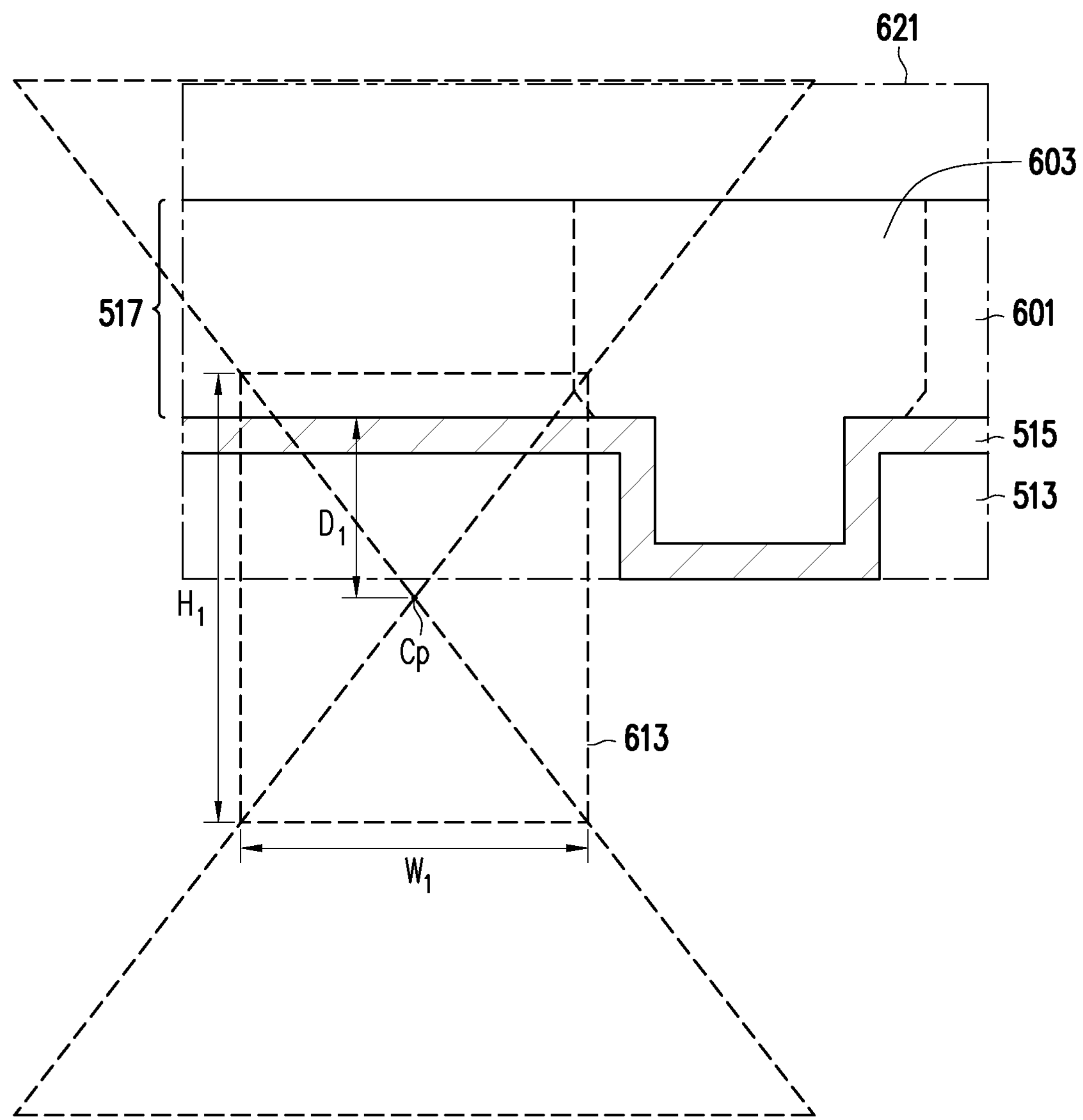

FIG. 6B illustrates a close up view of the box labeled 621 in FIG. 6A during the exposure process. As can be seen, during the exposure process, the desired energy 611 (e.g., light) does not come straight down but is, rather, made up of a plurality of individual beams which first converge and then diverge around a center point $C_P$. When the individual beams converge close enough to each other, and before the individual beams diverge far enough from each other, the individual beams will be focused with respect to each other and with respect to the photoresist 517. In an embodiment the energy 611 is focused so that all of the various divergent beams of the energy 611 are converged and are concentrated into an in-focus area 613 with a desired width. In a particular embodiment the in-focus area 613 will have a first width $W_1$ of between about 5 μm and about 500 μm, such as about 40 μm. However, any suitable width may be utilized.

Additionally, in embodiment in which the in-focus area 613 has the first width $W_1$, the in-focus area 613 will also have a first height $H_1$ that is centered around the center point $C_P$ of the in-focus area 613. The first height $H_1$ may be between about 1 μm and about 100 μm, such as about 40 μm. However, any suitable dimensions may be utilized.

However, in order to help the subsequently formed third external connection 901 avoid cracking and reduce the stress, the exposure process of the photoresist 517 is tuned in order to help shape the final structure of the third external connection 901. For example, in one embodiment the placement of the center point $C_P$ of the in-focus area 613 is not placed to be within the photoresist 517 itself. Rather, the center point $C_P$ of the in-focus area 613 is placed a first distance $D_1$ below the uppermost surface of the second seed layer 515. For example, in one embodiment the center point $C_P$ of the in-focus area 613 may be placed such that the first distance $D_1$ is between about 60 μm and about 70 μm, such as about 65 μm, below the uppermost surface of the second seed layer 515.

Figure 6C:
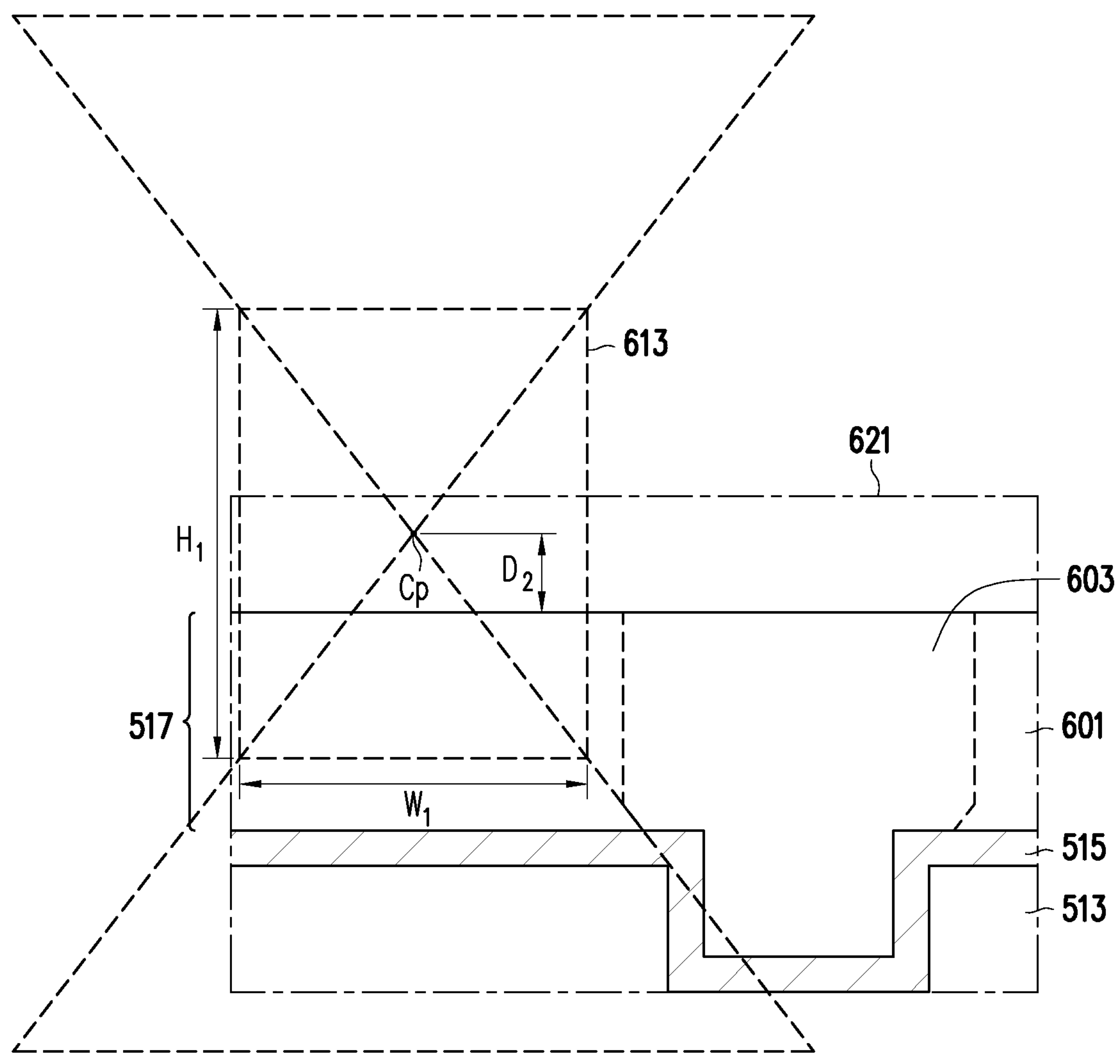

FIG. 6C illustrates another embodiment in which the in-focus area 613 is shifted away from being located in the center of the photoresist 517. In this embodiment, however, instead of being the center point $C_P$ being shifted downward such that the center point $C_P$ is located below the bottom surface of the photoresist 517, the center point $C_P$ is shifted in an opposite direction such that the center point $C_P$ is located over the photoresist 517. In this embodiment the center point $C_P$ may be shifted a second distance $D_2$ of between about 0 μm and about 60 μm, such as about 10 μm. However, any suitable dimension may be utilized.

Figure 6D:
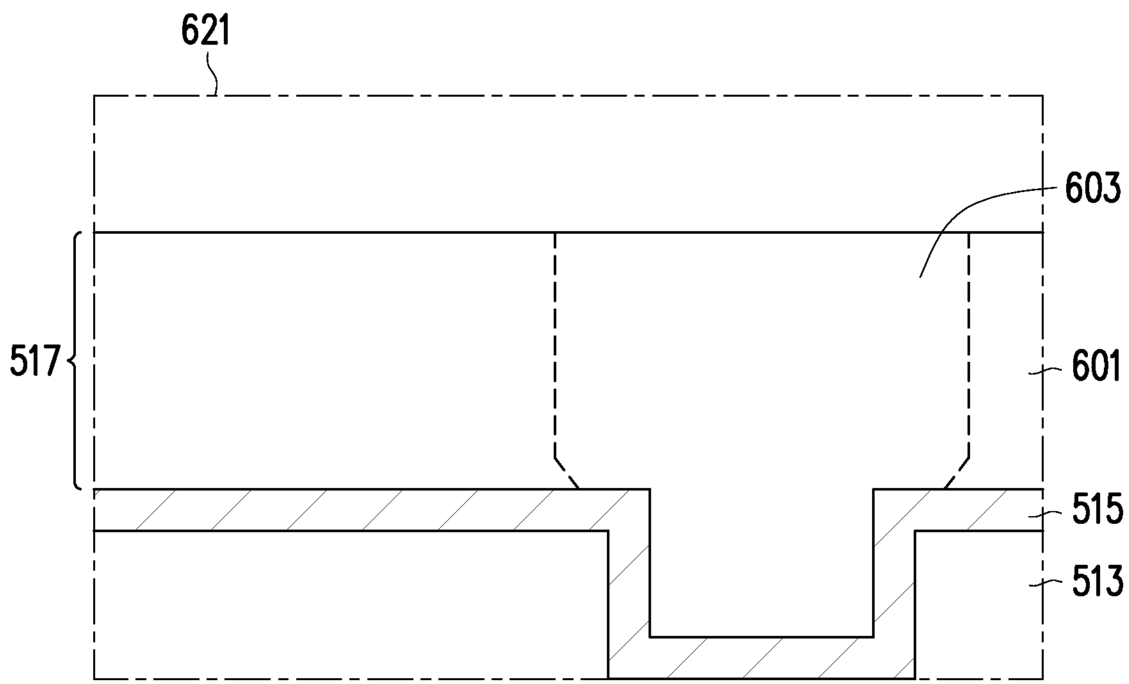

FIG. 6D illustrates one resulting structure of the photoresist 517 after the exposure of the photoresist 517 with the center point $C_P$ of the in-focus area 613 being shifted to be below the photoresist 517. As can be seen, with the center point $C_P$ shifted, the bottom portion of the unexposed region 603 is not straight but is, rather, angled with the remaining portions of the sidewalls of the unexposed region 603. Additionally, the unexposed region 603 is angled with respect to the second seed layer 515. This angled shape helps with the formation of the third external connection 901 (not illustrated in FIG. 6D but illustrated and described further below with respect to FIG. 9).

After the photoresist 517 has been exposed, a post-exposure baking may be used in order to assist in the generating, dispersing, and reacting of the acid/base/free radical generated from the impingement of the patterned energy 615 upon the PACs during the exposure. Such assistance helps to create or enhance chemical reactions which generate chemical differences between the exposed region 601 and the unexposed region 603 within the photoresist 517. These chemical differences also caused differences in the solubility between the exposed region 601 and the unexposed region 603. In an embodiment this post-exposure baking may occur at temperatures of between about 40° C. and about 200° C. for a period of between about 10 seconds and about 10 minutes. However, any suitable temperatures and times may be utilized.

Figure 7A:
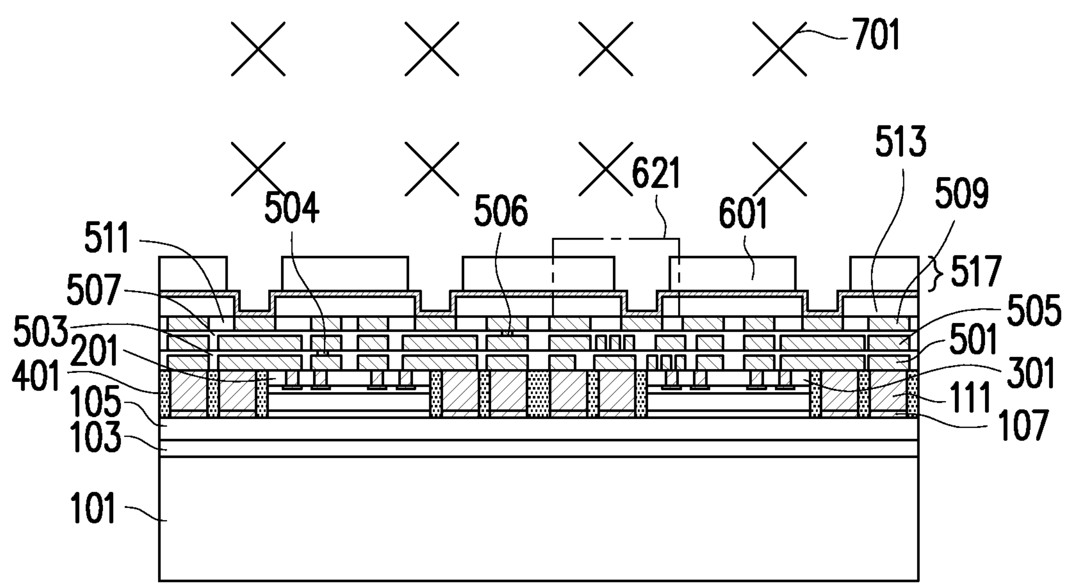
FIGS. 7A-7B illustrate a development of the photoresist in accordance with some embodiments.
Figure 7B:
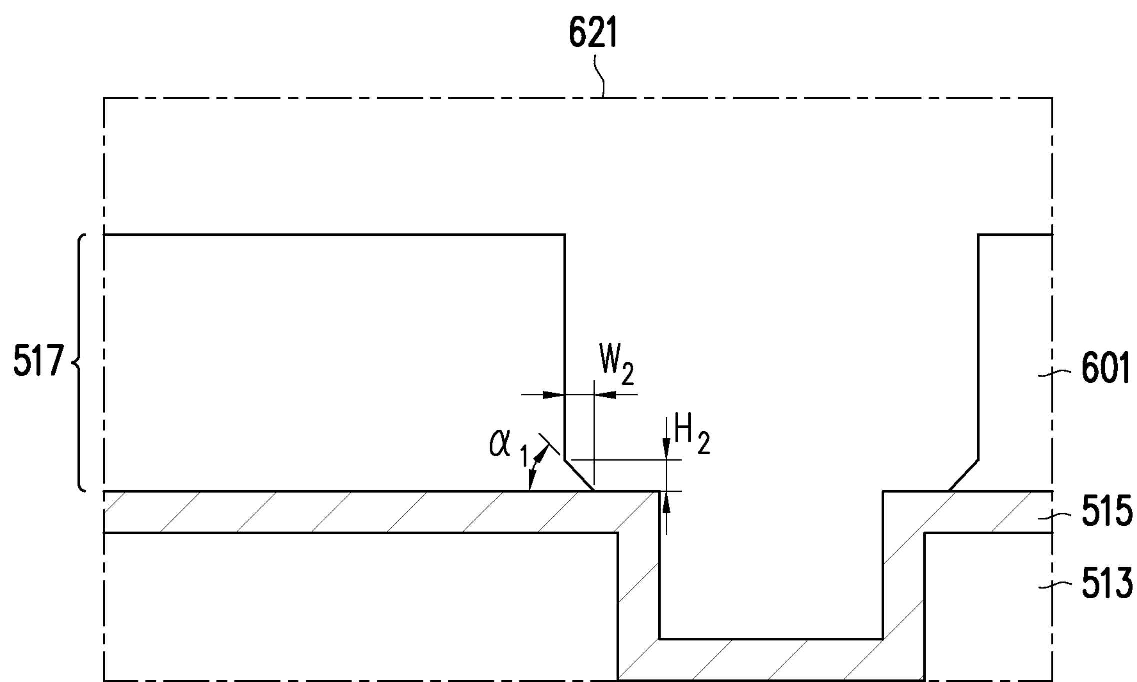

FIGS. 7A-7B illustrate a development of the photoresist 517 with the use of a developer 701 after the exposure of the photoresist 517 (with FIG. 7B illustrating a close up view of the dashed box labeled 621 in FIG. 7A). After the photoresist 517 has been exposed and the post-exposure baking has occurred, the photoresist 517 may be developed using either a negative tone developer or a positive tone developer, depending upon the desired pattern for the photoresist 517. In an embodiment in which the unexposed region 603 of the photoresist 517 is desired to be removed to form a negative tone, a negative tone developer such as an organic solvent or critical fluid may be utilized to remove those portions of the photoresist 517 which were not exposed to the patterned energy 615 and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, 2-heptanone, n-butyl acetate, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

If a positive tone development is desired, a positive tone developer such as a basic aqueous solution may be utilized to remove those portions of the photoresist 517 which were exposed to the patterned energy 615 and which have had their solubility modified and changed through the chemical reactions. Such basic aqueous solutions may include tetra methyl ammonium hydroxide (TMAH), tetra butyl ammonium hydroxide, sodium hydroxide, potassium hydroxide, sodium carbonate, sodium bicarbonate, sodium silicate, sodium metasilicate, aqueous ammonia, monomethylamine, dimethylamine, trimethylamine, monoethylamine, diethylamine, triethylamine, monoisopropylamine, diisopropylamine, triisopropylamine, monobutylamine, dibutylamine, monoethanolamine, diethanolamine, triethanolamine, dimethylaminoethanol, diethylaminoethanol, ammonia, caustic soda, caustic potash, sodium metasilicate, potassium metasilicate, sodium carbonate, tetraethylammonium hydroxide, combinations of these, or the like.

However, as one of ordinary skill in the art will recognize, the above description of positive tone developers and negative tone developers are only intended to be illustrative and are not intended to limit the embodiments to only the developers listed above. Rather, any suitable type of developer, including acid developers or even water developers, that may be utilized to selectively remove a portion of the photoresist 517 that has a different property (e.g., solubility) than another portion of the photoresist 517, may be utilized, and all such developers are fully intended to be included within the scope of the embodiments.

FIG. 7A illustrates an application of the developer 701 to the photoresist 517 using, e.g., a spin-on process. In this process the developer 701 is applied to the photoresist 517 from above the photoresist 517 while the semiconductor device 100 (and the photoresist 517) is rotated. In an embodiment the developer 701 may be supplied at a flow rate of between about 10 ml/min and about 2000 ml/min, such as about 1000 ml/min, while the semiconductor device 100 is being rotated at a speed of between about 100 rpm and about 3500 rpm, such as about 1500 rpm. In an embodiment the developer 701 may be at a temperature of between about 10° C. and about 80° C., such as about 50° C., and the development may continue for between about 1 minute to about 60 minutes, such as about 30 minutes.

However, while the spin-on method described herein is one suitable method for developing the photoresist 517 after exposure, it is intended to be illustrative and is not intended to limit the embodiments. Rather, any suitable method for development, including dip processes, puddle processes, spray-on processes, combinations of these, or the like, may be used. All such development processes are fully intended to be included within the scope of the embodiments.

FIG. 7B illustrates a cross-section of the development process in which a negative tone developer is utilized. As illustrated, the developer 701 is applied to the photoresist 517 and dissolves the unexposed region 603 of the photoresist 517. This dissolving and removing of the unexposed region 603 of the photoresist 517 leaves behind an opening within the photoresist 517 that patterns the photoresist 517 in the shape of the patterned energy 615, thereby transferring the pattern of the patterned mask 609 to the photoresist 517.

FIG. 7B also illustrates that, after the development process has been completed and the developer 701 has been removed from the photoresist 517, the opening within the photoresist 517 will have a bottom portion that is angled to intercept the second seed layer 515. In an embodiment the bottom portion may be at a first angle $\alpha_1$ of between about 5° and about 85°, such as about 45°. However, any suitable angle may be utilized.

Additionally, the bottom portion may be formed to have a second width $W_2$ of between about 0.1 μm and about 10 μm, such as about 5 μm. The bottom portion may also have a second height $H_2$ of between about 0.1 μm and about 10 μm, such as about 5 μm. However, any suitable dimensions may be utilized.

Figure 8:
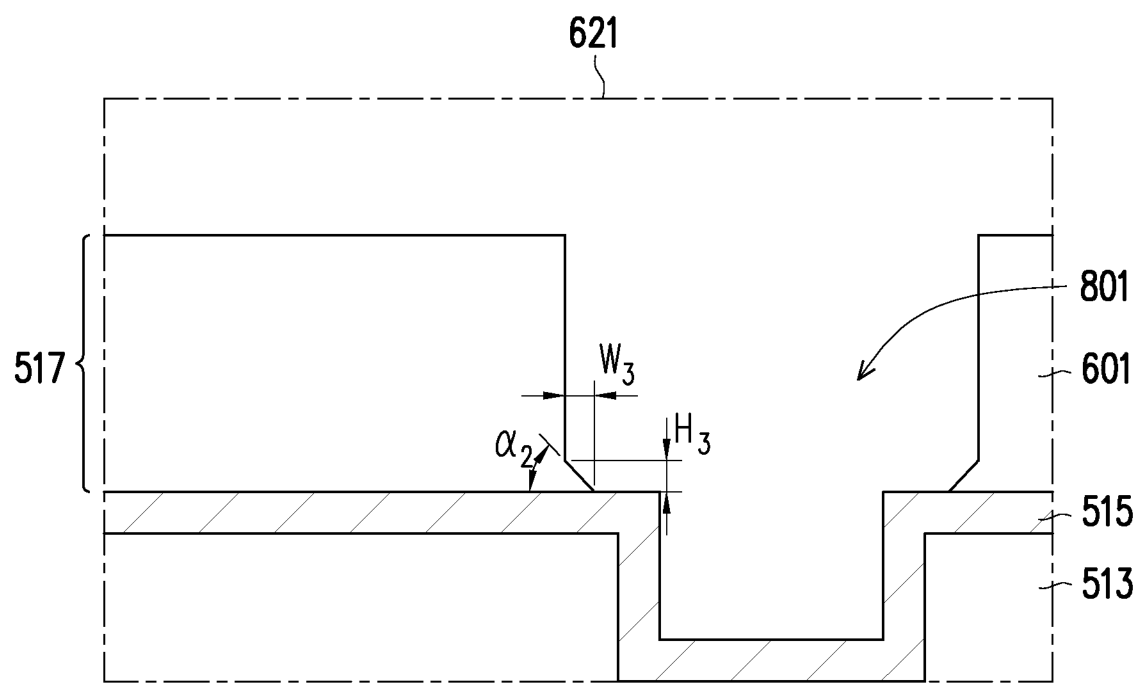
FIG. 8 illustrates a post-development annealing process in accordance with some embodiments.

FIG. 8 illustrates a close up view of the dashed box labeled 621 in FIG. 7A during a post developed annealing process (represented in FIG. 8 by the wavy lines labeled 801) that is utilized to help reshape the opening through the photoresist 517. In an embodiment the annealing process 801 may be a thermal anneal wherein the photoresist 517 is heated within, e.g., a furnace, within an inert atmosphere. The annealing process 801 may be performed at a temperature that is above the glass transition temperature ($T_g$), such as between about 100° C. and about 130° C., such as about 120° C., and may be continued for a time of between about 120 s and about 7 min, such as about 5 min. However, any suitable process conditions may be utilized.

During the annealing process 801, the temperature will be raised above the glass transition temperature of the photoresist 517, and the photoresist 517 will slightly melt and partially reshape itself, thereby also reshaping the openings through the photoresist 517. As such, while the angled bottom portion will still be present after the annealing process 801, the annealing process 801 will at least partially reshape the bottom portion such that after the annealing process 801 the bottom portion may be at a second angle $\alpha_2$ or flare angle that is different from the first angle $\alpha_1$, such as being between about 10° and about 85°, such as about 45°. Further, after the annealing process 801 the bottom portion may be formed to have a third width $W_3$ of between about 0.5 μm and about 11 μm, such as about 5 μm, and a third height $H_3$ of between about 0.5 μm and about 11 μm, such as about 5 μm. However, any suitable dimensions may be utilized.

Figure 9:
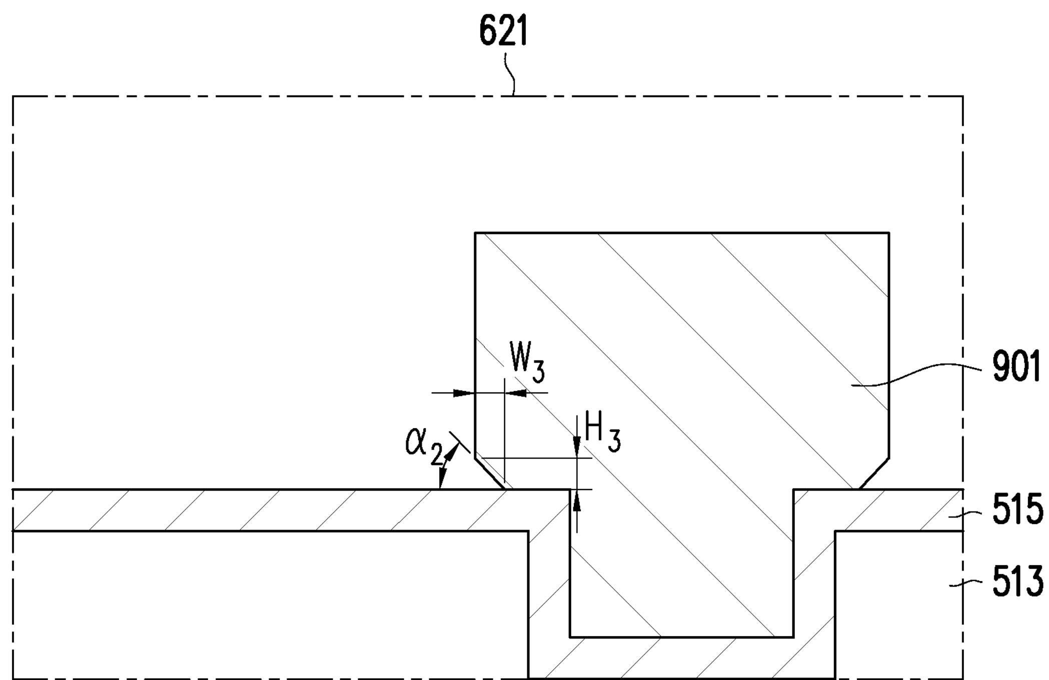
FIG. 9 illustrates a formation of an external connection in accordance with some embodiments.

FIG. 9 illustrates a close-up view of the dashed box labeled 621 in FIG. 7A in which, once the photoresist 517 has been patterned and the annealing process 801 has been performed, the third external connection 901 may be formed within the openings of the photoresist 517. In an embodiment the third external connection 901 may be, for example, a copper pillar and may comprise one or more conductive materials, such as copper, tungsten, other conductive metals, or the like, and may be formed, for example, by electroplating, electroless plating, or the like. In an embodiment, an electroplating process is used wherein the second seed layer 515 and the photoresist 517 are submerged or immersed in an electroplating solution such as a copper sulfate ($CuSO_4$) containing solution. The second seed layer 515 surface is electrically connected to the negative side of an external DC power supply such that the second seed layer 515 functions as the cathode in the electroplating process. A solid conductive anode, such as a copper anode, is also immersed in the solution and is attached to the positive side of the power supply. The atoms from the anode are dissolved into the solution, from which the cathode, e.g., the second seed layer 515, acquires the dissolved atoms, thereby plating the exposed conductive areas of the second seed layer 515 within the opening of the photoresist 517.

However, by using the exposure process and reshaping processes described herein, at least some of the negative side effects of the plating process may be reduced or eliminated. In particular, by reshaping the opening through the photoresist 517, the profile can help to avoid the plating solution (e.g., the $CuSO_4$ plating solution) from penetrating into the photoresist and causing a risk of underplating during the plating process.

Once the third external connection 901 has been formed using the photoresist 517 and the second seed layer 515, the photoresist 517 may be removed using a suitable removal process. In an embodiment, a plasma ashing process may be used to remove the photoresist 517, whereby the temperature of the photoresist 517 may be increased until the photoresist 517 experiences a thermal decomposition and may be removed. However, any other suitable process, such as a wet strip, may be utilized. The removal of the photoresist 517 may expose the underlying portions of the second seed layer 515.

By plating the third external connection 901 into an opening formed through the photoresist 517, the third external connection 901 will take on the shape of the opening through the photoresist 517. As such, the third external connection 901 will also have a middle portion outside of the sixth passivation layer 513 and the second seed layer 515, wherein the middle portion is angled inwards at an angle to the underlying seed layer. In an embodiment the middle portion has the second angle $\alpha_2$, the third width $W_3$, and the third height $H_3$. However, any suitable dimensions may be utilized.

Figure 10:
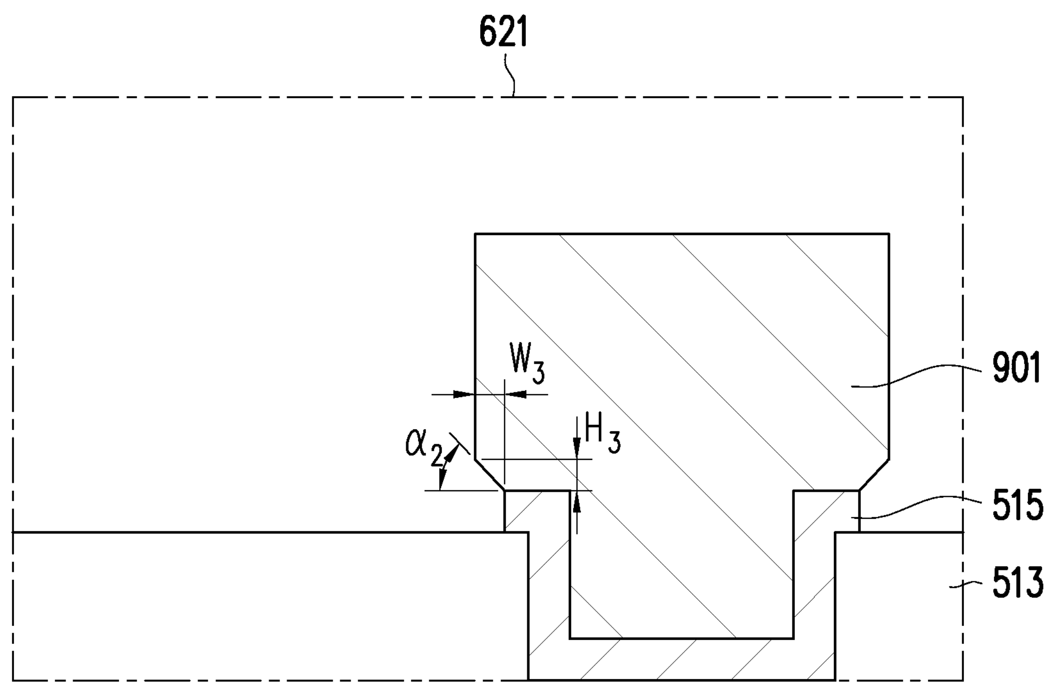
FIG. 10 illustrates a patterning of a seed layer in accordance with some embodiments.

FIG. 10 illustrates that, once the second seed layer 515 has been exposed, a removal of the exposed portions of the second seed layer 515 may be performed. In an embodiment the exposed portions of the second seed layer 515 (e.g., those portions that are not covered by the third external connection 901) may be removed by, for example, a wet or dry etching process. For example, in a dry etching process reactants may be directed towards the second seed layer 515 using the third external connection 901 as masks, thereby forming the second seed layer 515 to have a straight sidewall perpendicular with a surface of the sixth passivation layer 513. In another embodiment, etchants may be sprayed or otherwise put into contact with the second seed layer 515 in order to remove the exposed portions of the second seed layer 515.

By forming the third external connection 901 as described above, the profile of the third external connection 901 can be modified to under-cut the third external connection 901 and help to reduce or eliminate cracks that can form between the third external connection 901 and the underlying passivation layer. In particular, the under-cut of the third external connection 901 helps to reduce compressional stress during reliability torture tests. With the possibility of cracks reduced, a smaller pitch size can be obtained while still passing torture tests.

Figure 11:
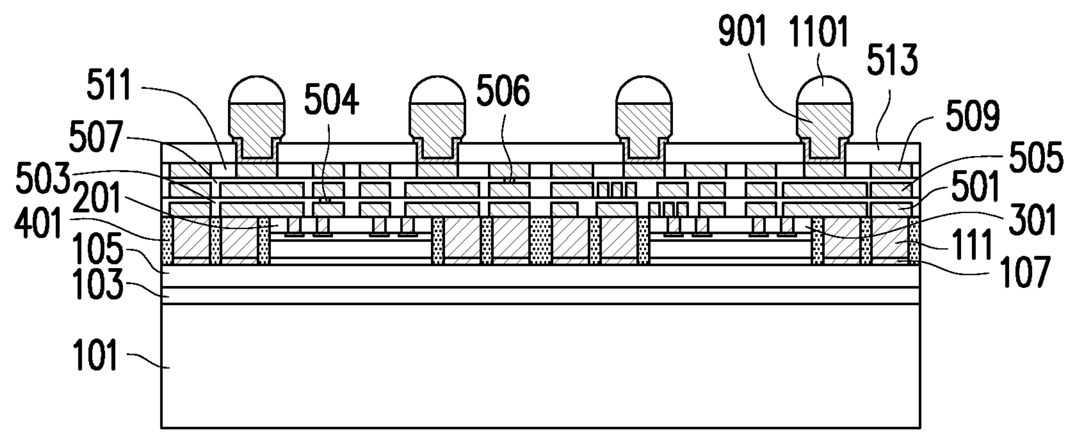
FIG. 11 illustrates a formation of conductive bumps on the external connection in accordance with some embodiments.

FIG. 11 illustrates a formation of fourth external connections 1101 on the third external connections 901. In an embodiment the fourth external connections 1101 may be contact bumps such as microbumps or controlled collapse chip connection (C4) bumps and may comprise a material such as tin, or other suitable materials, such as silver or copper. In an embodiment in which the fourth external connections 1101 are contact bumps, the fourth external connections 1101 may comprise a material such as tin, or other suitable materials, such as silver, lead-free tin, or copper. In an embodiment in which the fourth external connection 1101 is a tin solder bump, the fourth external connection 1101 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape which may have a critical dimension of between about 60 μm and about 100 μm, and may be formed in either a round shape or an elliptical shape.

Additionally, in an embodiment the fourth external connections 1101 may be formed in the shape of a circle in a top down view. However, this is merely intended to be illustrative and is not intended to be limit the embodiments. Rather, any suitable shape, such as an elliptical shape, or a combination of shapes, may also be utilized.

Figure 12:
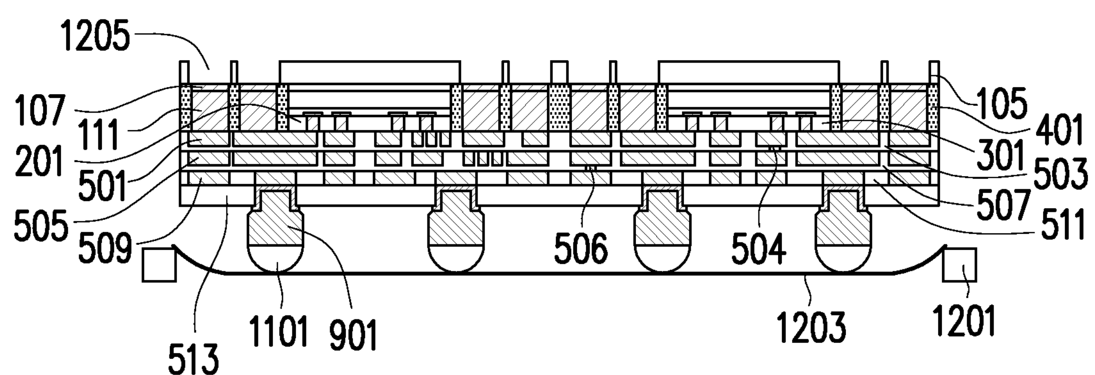
FIG. 12 illustrates a debonding of the carrier wafer in accordance with some embodiments.

FIG. 12 illustrates a debonding of the carrier substrate 101 from the first semiconductor device 201 and the second semiconductor device 301. In an embodiment the fourth external connection 1101 and, hence, the structure including the first semiconductor device 201 and the second semiconductor device 301, may be attached to a ring structure 1201. The ring structure 1201 may be a metal ring intended to provide support and stability for the structure during and after the debonding process. In an embodiment the fourth external connection 1101, the first semiconductor device 201, and the second semiconductor device 301 are attached to the ring structure using, e.g., a ultraviolet tape 1203, although any other suitable adhesive or attachment may be used.

Once the fourth external connection 1101 and, hence, the structure including the first semiconductor device 201 and the second semiconductor device 301 are attached to the ring structure 1201, the carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the carrier substrate 101 and the adhesive layer 103 may be physically separated and removed from the structure comprising the fourth external connection 1101, the first semiconductor device 201, and the second semiconductor device 301.

FIG. 12 additionally illustrates a patterning of the polymer layer 105 in order to expose the vias 111 (along with the associated first seed layer 107). In an embodiment the polymer layer 105 may be patterned using, e.g., a laser drilling method. In such a method a protective layer, such as a light-to-heat conversion (LTHC) layer or a hogomax layer (not separately illustrated in FIG. 12) is first deposited over the polymer layer 105. Once protected, a laser is directed towards those portions of the polymer layer 105 which are desired to be removed in order to expose the underlying vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be performed to form fourth openings 1205 over the vias 111 to have a width of between about 100 μm and about 300 μm, such as about 200 μm.

In another embodiment, the polymer layer 105 may be patterned by initially applying a photoresist (not individually illustrated in FIG. 12) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Figure 13:
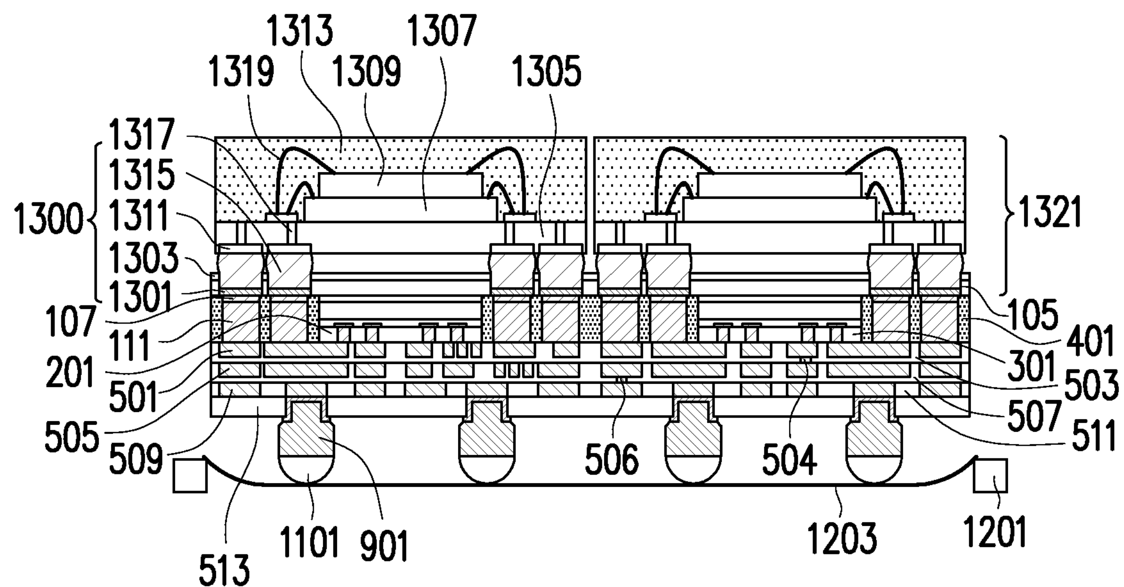
FIG. 13 illustrates a bonding of a second package in accordance with some embodiments.

FIG. 13 illustrates a placement of a backside ball pad 1301 within the openings of the polymer layer 105 in order to protect the now exposed vias 111. In an embodiment the backside ball pads 1301 may comprise a conductive material such as solder on paste or an oxygen solder protection (OSP), although any suitable material may be utilized. In an embodiment the backside ball pads 1301 may be applied using a stencil, although any suitable method of application may be utilized, and then reflowed in order to form a bump shape.

FIG. 13 also illustrates a placement and patterning of a backside protection layer 1303 over the backside ball pads 1301, effectively sealing the joint between the backside ball pads 1301 and the vias 111 from intrusion by moisture. In an embodiment the backside protection layer 1303 may be a protective material such as a PBO, Solder Resistance (SR), Lamination Compound (LC) tape, Ajinomoto build-up film (ABF), non-conductive paste (NCP), non-conductive film (NCF), patterned underfill (PUF), warpage improvement adhesive (WIA), liquid molding compound V9, combinations of these, or the like. However, any suitable material may also be used. The backside protection layer 1303 may be applied using a process such as screen printing, lamination, spin coating, or the like, to a thickness of between about 1 μm to about 200 μm.

FIG. 13 also illustrates that, once the backside protection layer 1303 has been placed, the backside protection layer 1303 may be patterned in order to expose the backside ball pads 1301. In an embodiment the backside protection layer 1303 may be patterned using, e.g., a laser drilling method, by which a laser is directed towards those portions of the backside protection layer 1303 which are desired to be removed in order to expose the backside ball pads 1301. During the laser drilling process the drill energy may be in a range from 0.1 mJ to about 30 mJ, and a drill angle of about 0 degree (perpendicular to the backside protection layer 1303) to about 85 degrees to normal of the backside protection layer 1303. In an embodiment the exposure may form openings with a diameter of between about 30 μm and about 300 μm, such as about 150 μm.

In another embodiment, the backside protection layer 1303 may be patterned by initially applying a photoresist (not individually illustrated in FIG. 13) to the backside protection layer 1303 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the backside protection layer 1303 are removed with, e.g., a dry etch process. However, any other suitable method for patterning the backside protection layer 1303 may be utilized.

FIG. 13 also illustrates a bonding of the backside ball pads 1301 to a first package 1300. In an embodiment the first package 1300 may comprise a third substrate 1305, a third semiconductor device 1307, a fourth semiconductor device 1309 (bonded to the third semiconductor device 1307), third contact pads 1311, a second encapsulant 1313, and fifth external connections 1315. In an embodiment the third substrate 1305 may be, e.g., a packaging substrate comprising internal interconnects (e.g., through substrate vias 1317) to connect the third semiconductor device 1307 and the fourth semiconductor device 1309 to the backside ball pads 1301.

In another embodiment, the third substrate 1305 may be an interposer used as an intermediate substrate to connect the third semiconductor device 1307 and the fourth semiconductor device 1309 to the backside ball pads 1301. In this embodiment the third substrate 1305 may be, e.g., a silicon substrate, doped or undoped, or an active layer of a silicon-on-insulator (SOI) substrate. However, the third substrate 1305 may also be a glass substrate, a ceramic substrate, a polymer substrate, or any other substrate that may provide a suitable protection and/or interconnection functionality. These and any other suitable materials may be used for the third substrate 1305.

The third semiconductor device 1307 may be a semiconductor device designed for an intended purpose such as being a logic die, a central processing unit (CPU) die, a memory die (e.g., a DRAM die), combinations of these, or the like. In an embodiment the third semiconductor device 1307 comprises integrated circuit devices, such as transistors, capacitors, inductors, resistors, metallization layers (not shown), and the like, therein, as desired for a particular functionality. In an embodiment the third semiconductor device 1307 is designed and manufactured to work in conjunction with or concurrently with the first semiconductor device 201.

The fourth semiconductor device 1309 may be similar to the third semiconductor device 1307. For example, the fourth semiconductor device 1309 may be a semiconductor device designed for an intended purpose (e.g., a DRAM die) and comprising integrated circuit devices for a desired functionality. In an embodiment the fourth semiconductor device 1309 is designed to work in conjunction with or concurrently with the first semiconductor device 201 and/or the third semiconductor device 1307.

The fourth semiconductor device 1309 may be bonded to the third semiconductor device 1307. In an embodiment the fourth semiconductor device 1309 is only physically bonded with the third semiconductor device 1307, such as by using an adhesive. In this embodiment the fourth semiconductor device 1309 and the third semiconductor device 1307 may be electrically connected to the third substrate 1305 using, e.g., wire bonds 1319, although any suitable electrical bonding may be utilized.

In another embodiment, the fourth semiconductor device 1309 may be bonded to the third semiconductor device 1307 both physically and electrically. In this embodiment the fourth semiconductor device 1309 may comprise external connections (not separately illustrated in FIG. 13) that connect with external connections (also not separately illustrated in FIG. 13) on the third semiconductor device 1307 in order to interconnect the fourth semiconductor device 1309 with the third semiconductor device 1307.

The third contact pads 1311 may be formed on the third substrate 1305 to form electrical connections between the third semiconductor device 1307 and, e.g., the fifth external connections 1315. In an embodiment the third contact pads 1311 may be formed over and in electrical contact with electrical routing (such as through substrate vias 1317) within the third substrate 1305. The third contact pads 1311 may comprise aluminum, but other materials, such as copper, may be used. The third contact pads 1311 may be formed using a deposition process, such as sputtering, to form a layer of material (not shown) and portions of the layer of material may then be removed through a suitable process (such as photolithographic masking and etching) to form the third contact pads 1311. However, any other suitable process may be utilized to form the third contact pads 1311. The third contact pads 1311 may be formed to have a thickness of between about 0.5 μm and about 4 μm, such as about 1.45 μm.

The second encapsulant 1313 may be used to encapsulate and protect the third semiconductor device 1307, the fourth semiconductor device 1309, and the third substrate 1305. In an embodiment the second encapsulant 1313 may be a molding compound and may be placed using a molding device (not illustrated in FIG. 13). For example, the third substrate 1305, the third semiconductor device 1307, and the fourth semiconductor device 1309 may be placed within a cavity of the molding device, and the cavity may be hermetically sealed. The second encapsulant 1313 may be placed within the cavity either before the cavity is hermetically sealed or else may be injected into the cavity through an injection port. In an embodiment the second encapsulant

1313 may be a molding compound resin such as polyimide, PPS, PEEK, PES, a heat resistant crystal resin, combinations of these, or the like.

Once the second encapsulant 1313 has been placed into the cavity such that the second encapsulant 1313 encapsulates the region around the third substrate 1305, the third semiconductor device 1307, and the fourth semiconductor device 1309, the second encapsulant 1313 may be cured in order to harden the second encapsulant 1313 for optimum protection. While the exact curing process is dependent at least in part on the particular material chosen for the second encapsulant 1313, in an embodiment in which molding compound is chosen as the second encapsulant 1313, the curing could occur through a process such as heating the second encapsulant 1313 to between about 100° C. and about 130° C., such as about 125° C. for about 60 sec to about 3000 sec, such as about 600 sec. Additionally, initiators and/or catalysts may be included within the second encapsulant 1313 to better control the curing process.

However, as one having ordinary skill in the art will recognize, the curing process described above is merely an exemplary process and is not meant to limit the current embodiments. Other curing processes, such as irradiation or even allowing the second encapsulant 1313 to harden at ambient temperature, may be used. Any suitable curing process may be used, and all such processes are fully intended to be included within the scope of the embodiments discussed herein.

In an embodiment the fifth external connections 1315 may be formed to provide an external connection between the third substrate 1305 and, e.g., the backside ball pads 1301. The fifth external connections 1315 may be contact bumps such as microbumps or controlled collapse chip connection (C4) bumps and may comprise a material such as tin, or other suitable materials, such as silver or copper. In an embodiment in which the fifth external connections 1315 are tin solder bumps, the fifth external connections 1315 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

Once the fifth external connections 1315 have been formed, the fifth external connections 1315 are aligned with and placed into physical contact with the backside ball pads 1301, and a bonding is performed. For example, in an embodiment in which the fifth external connections 1315 are solder bumps, the bonding process may comprise a reflow process whereby the temperature of the fifth external connections 1315 is raised to a point where the fifth external connections 1315 will liquefy and flow, thereby bonding the first package 1300 to the backside ball pads 1301 once the fifth external connections 1315 resolidifies.

FIG. 13 additionally illustrates the bonding of a second package 1321 to the backside ball pads 1301. In an embodiment the second package 1321 may be similar to the first package 1300, and may be bonded to the backside ball pads 1301 utilizing similar processes. However, the second package 1321 may also be different from the first package 1300.

Figure 14:
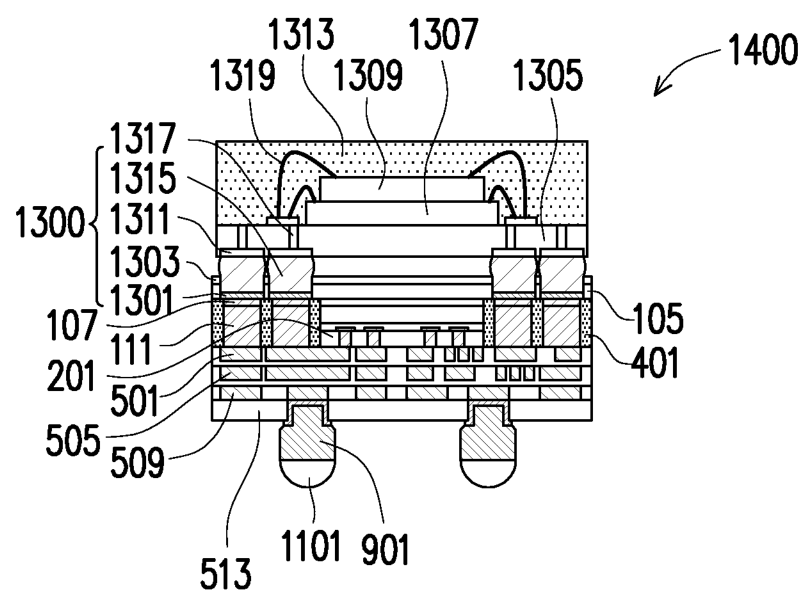
FIG. 14 illustrates a singulation in accordance with some embodiments.

FIG. 14 illustrates a debonding of the fourth external connections 1101 from the ring structure 1201 and a singulation of the structure to form a first integrated fan out package-on-package (InFO-POP) structure 1400. In an embodiment the fourth external connections 1101 may be debonded from the ring structure 1201 by initially bonding the first package 1300 and the second package 1321 to a second ring structure using, e.g., a second ultraviolet tape. Once bonded, the ultraviolet tape 1203 may be irradiated with ultraviolet radiation and, once the ultraviolet tape 1203 has lost its adhesiveness, the fourth external connections 1101 may be physically separated from the ring structure 1201.

Once debonded, a singulation of the structure to form the first InFO-POP structure 1400 is performed. In an embodiment the singulation may be performed by using a saw blade (not shown) to slice through the encapsulant 401 and the polymer layer 105 between the vias 111, thereby separating one section from another to form the first InFO-POP structure 1400 with the first semiconductor device 201. However, as one of ordinary skill in the art will recognize, utilizing a saw blade to singulate the first InFO-POP structure 1400 is merely one illustrative embodiment and is not intended to be limiting. Other methods for singulating the first InFO-POP structure 1400, such as utilizing one or more etches to separate the first InFO-POP structure 1400, may also be utilized. These methods and any other suitable methods may be utilized to singulate the first InFO-POP structure 1400.

In accordance with an embodiment, a method of manufacturing a semiconductor device includes: applying a photoresist over a seed layer; exposing the photoresist to a patterned energy source, the patterned energy source having an in-focus area with a center point, the center point located below a surface of the photoresist facing towards the seed layer; developing the photoresist to form an opening; and plating an external connector into the opening. In an embodiment the method further includes annealing the photoresist after the developing the photoresist, wherein the annealing the photoresist reshapes the opening. In an embodiment the annealing the photoresist raises a temperature of the photoresist to between about 110° C. and about 130° C. In an embodiment the center point is located below the surface of the photoresist a distance of between about 60 μm and about 70 μm. In an embodiment the method further includes removing a portion of the seed layer not covered by the external connector. In an embodiment the developing the photoresist comprises removing an unexposed portion of the photoresist. In an embodiment the seed layer is located over an encapsulant around a semiconductor device and a through encapsulant via.

In accordance with another embodiment, a method of manufacturing a semiconductor device includes: exposing a photoresist to a patterned energy source, the photoresist being located over an encapsulant located between a semiconductor die and a through encapsulant via; developing the photoresist to form an opening with a first shape; performing a post-development baking process to reshape the opening into a second shape different from the first shape, wherein the second shape comprises a flare near a bottom of the opening; and plating a conductive material into the opening. In an embodiment the exposing the photoresist focuses the patterned energy source to form an in-focus area, the in-focus area having a center point below the photoresist. In an embodiment the center point is located below the photoresist a distance of between about 60 μm and about 70 μm. In an embodiment the post-development baking process raises a temperature of the photoresist to a temperature between about 100° C. and about 130° C. In an embodiment the flare extends in a first direction parallel with a major surface of the encapsulant a first distance, the first distance being between about 0.1 μm and about 10 μm. In an embodiment the flare extends in a second direction perpendicular with the major surface of the encapsulant a second distance, the second distance between about 0.5 μm and about 10 μm. In an embodiment the flare is located at a flare angle of between about 10° and about 85°.

In accordance with yet another embodiment, a semiconductor device includes: a semiconductor die; an encapsulant encapsulating the semiconductor die; a through encapsulant via extending from a first side of the encapsulant to a second side of the encapsulant; a passivation layer over the encapsulant; and an external connector over the encapsulant, the external connector including: a first portion with a first width, the first portion extending through the passivation layer; a second portion with a second width larger than the first width, the second portion being located outside of the passivation layer; and a tapered portion extending from the second portion to the first portion. In an embodiment the tapered portion is located at a tapered angle to a line, the line being parallel with a major surface of the encapsulant, the tapered angle being between about 10° and about 85°. In an embodiment the semiconductor device further includes a solder ball in physical contact with the external connector, the solder ball having an oval shape. In an embodiment the semiconductor device further includes a solder ball in physical contact with the external connector, the solder ball having a round shape. In an embodiment the semiconductor device further includes a seed layer located between the external connector and the passivation layer, the seed layer having a straight sidewall perpendicular to a surface of the passivation layer. In an embodiment the semiconductor device further includes a redistribution layer located between the external connector and the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

applying a photoresist over a seed layer;

exposing the photoresist to a patterned energy source, the patterned energy source having an in-focus area with a center point, the center point located below a surface of the photoresist facing towards the seed layer;

developing the photoresist to form an opening; and plating an external connector into the opening.

2. The method of claim 1, further comprising annealing the photoresist after the developing the photoresist, wherein the annealing the photoresist reshapes the opening.

3. The method of claim 2, wherein the annealing the photoresist raises a temperature of the photoresist to between about 110° C. and about 130° C.

4. The method of claim 1, wherein the center point is located below the surface of the photoresist a distance of between about 60 μm and about 70 μm.

5. The method of claim 1, further comprising removing a portion of the seed layer not covered by the external connector.

6. The method of claim 1, wherein the developing the photoresist comprises removing an unexposed portion of the photoresist.

7. The method of claim 1, wherein the seed layer is located over an encapsulant around a semiconductor device and a through encapsulant via.

8. A method of manufacturing a semiconductor device, the method comprising:

exposing a photoresist to a patterned energy source, the photoresist being located over an encapsulant located between a semiconductor die and a through encapsulant via;

developing the photoresist to form an opening with a first shape;

performing a post-development baking process to reshape the opening into a second shape different from the first shape, wherein the second shape comprises a flare near a bottom of the opening; and plating a conductive material into the opening.

9. The method of claim 8, wherein the exposing the photoresist focuses the patterned energy source to form an in-focus area, the in-focus area having a center point below the photoresist.

10. The method of claim 9, wherein the center point is located below the photoresist a distance of between about 60 μm and about 70 μm.

11. The method of claim 8, wherein the post-development baking process raises a temperature of the photoresist to a temperature between about 100° C. and about 130° C.

12. The method of claim 8, wherein the flare extends in a first direction parallel with a major surface of the encapsulant a first distance, the first distance being between about 0.1 μm and about 10 μm.

13. The method of claim 12, wherein the flare extends in a second direction perpendicular with the major surface of the encapsulant a second distance, the second distance between about 0.5 μm and about 11 μm.

14. The method of claim 8, wherein the flare is located at a flare angle of between about 10° and about 85°.

15. A method of manufacturing a semiconductor device, the method comprising:

placing a semiconductor die adjacent to a through encapsulant via, the through encapsulant via also being adjacent to a seed layer;

encapsulating the semiconductor die, the seed layer, and the through encapsulant via with an encapsulant, wherein after the encapsulating a combination of the through encapsulant via and the seed layer extends from a first side of the encapsulant to a second side of the encapsulant;

placing a passivation layer over the encapsulant; and forming an external connector over the encapsulant, the forming the external connector comprising:

applying a photoresist over the seed layer;

exposing the photoresist to a patterned energy source, the patterned energy source having an in-focus area with a center point, the center point located below a surface of the photoresist facing towards the seed layer;

developing the photoresist to form an opening;

plating the external connector into the opening, wherein after the plating the external connector the external connector has:

a first portion with a first width, the first portion extending through the passivation layer;

a second portion with a second width larger than the first width, the second portion being located outside of the passivation layer; and a tapered portion extending from the second portion to the first portion.

16. The method of claim 15, wherein the tapered portion is located at a tapered angle to a line, the line being parallel with a major surface of the encapsulant, the tapered angle being between about 10° and about 85°.

17. The method of claim 15, further comprising placing a solder ball in physical contact with the external connector, the solder ball having an oval shape.

18. The method of claim 17, further comprising placing a solder ball in physical contact with the external connector, the solder ball having a round shape.

19. The method of claim 15, further comprising forming a seed layer over the passivation layer prior to the forming the external connector, wherein after forming the external connector the seed layer is patterned to have a straight sidewall perpendicular to a surface of the passivation layer.

20. The method of claim 15, further comprising forming a redistribution layer over the encapsulant prior to the forming the external connector.

* * * * *